(12) United States Patent
Chang

(10) Patent No.: US 9,621,136 B1
(45) Date of Patent: Apr. 11, 2017

(54) DATA SAMPLER CIRCUIT WITH EQUALIZATION FUNCTION AND METHOD FOR SAMPLING DATA

(71) Applicant: FREESCALE SEMICONDUCTOR, INC., Austin, TX (US)

(72) Inventor: Kevin Yi Cheng Chang, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/939,273

(22) Filed: Nov. 12, 2015

(51) Int. Cl.
  H04L 27/08 (2006.01)
  H03K 3/356 (2006.01)
  H04B 1/12 (2006.01)

(52) U.S. Cl.
  CPC ......... *H03K 3/35613* (2013.01); *H04B 1/123* (2013.01)

(58) Field of Classification Search
  CPC .... H03G 3/3052; H03G 3/3068; H03G 3/001; H03G 3/3078; H04L 27/3809; H04L 27/2647; H04L 1/20; H04L 27/2601; H04L 1/0025; H04N 5/4401; H04B 1/403; H04B 1/30; H04B 1/28; H04B 1/40; H04B 3/23
  USPC ................................. 375/345, 316, 219, 295
  See application file for complete search history.

(56) References Cited

U.S. PATENT DOCUMENTS

| 8,437,388 B2 | 5/2013 | Zeng et al. |
| 8,680,937 B2 | 3/2014 | Chang |
| 8,816,782 B2 | 8/2014 | Chang |
| 2005/0134306 A1* | 6/2005 | Stojanovic ............ H04L 25/028 326/31 |
| 2005/0285631 A1 | 12/2005 | Goldman et al. |
| 2008/0024215 A1* | 1/2008 | Gopalakrishnan .. H03M 1/1245 330/250 |

OTHER PUBLICATIONS

Fukuda et al, "An 8Gb/s Transceiver with 3x-Oversampling 2-Threshold Eye-Tracking CDR Circuit for -36.8dB-loss Backplane", IEEE International Solid-State Circuits Conference, Feb. 3-7, 2008, pp. 98-598.
Iravani et al, "Clock and data recovery for 1.25 Gb/s Ethernet transceiver in 0.35 um CMOS", Proceedings of the IEEE Custom Integrated Circuits, May 16-19, 1999, pp. 261-264.
Toifl et al, "A 22-Gb/s PAM-4 Receiver in 90-nm CMOS SOI Technology", IEEE Journal of Solid-State Circuits, Apr. 2006, pp. 954-965, vol. 41, No. 4.

* cited by examiner

*Primary Examiner* — Zewdu Kassa

(57) ABSTRACT

A data sampler circuit comprises a transconductance amplifier, a latch circuit, a current-to-voltage converter, and a negative resistance circuit. The transconductance amplifier has an input and an output. The latch circuit is coupled to the output of the transconductance amplifier. The current-to-voltage converter has an input coupled to the output of the transconductance amplifier, and an output for providing a feedback signal to the latch circuit. The negative resistance circuit is coupled to the output of the transconductance amplifier and provides equalization during both a sampling mode and a data latching mode. In one embodiment, the negative resistance circuit comprises a pair of cross-coupled transistors. A gain of the negative resistance circuit can be adjusted based on a pulse width of an input signal.

20 Claims, 3 Drawing Sheets

DATA SAMPLER CIRCUIT WITH EQUALIZATION FUNCTION AND METHOD FOR SAMPLING DATA

BACKGROUND

Field

This disclosure relates generally to electronic circuits and more specifically to a sampler circuit having an equalization function and a method for sampling data.

Related Art

A sampler circuit is used in a receiver to sample and latch a data input signal in response to a timing signal. The amplitude of received data can vary due to inter-symbol interference (ISI) given by channel loss or attenuation. The received signal may present a very small amplitude due to the channel attenuation. An equalizer may be used to compensate for varying amplitudes. Also, the operating frequency of the data sampler may be constrained by the RC time constant of the sampler output. This may cause the input sensitivity of the sampler to decrease as clock frequency increases.

Therefore, a need exists for a data sampler with equalization for use in a receiver that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
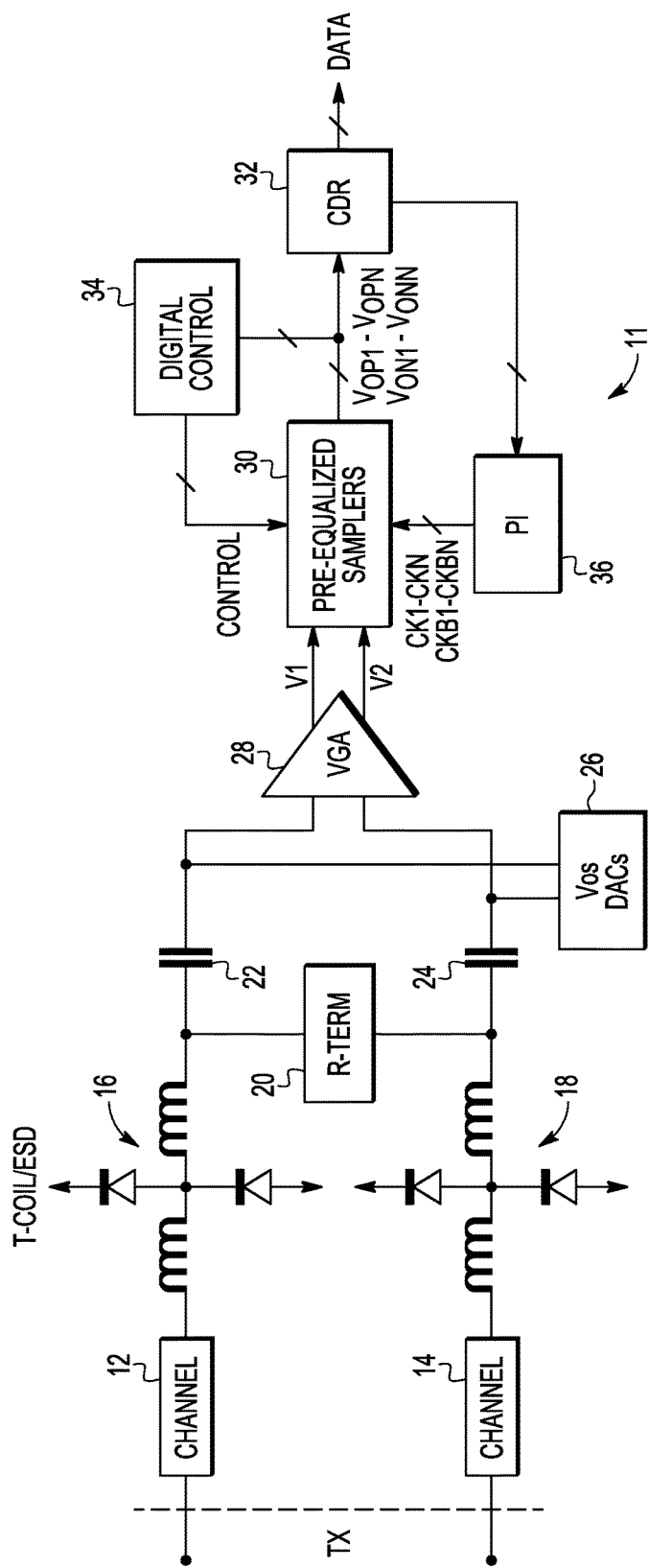
FIG. 1 illustrates a serial data transmission system in accordance with an embodiment.

Generally, there is provided, a receiver coupled to a transmitter through one or more channels. The receiver includes a plurality of data sampler circuits. Each of the data sampler circuits includes a transconductance amplifier, a latch circuit, a current-to-voltage converter, and a variable gain negative resistance equalizing circuit. The transconductance amplifier has an input and an output. The latch circuit is coupled to the output of the transconductance amplifier. The current-to-voltage converter has an input coupled to the output of the transconductance amplifier, and an output for providing a feedback signal to the latch circuit. The variable gain negative resistance equalizing circuit is coupled to the output of the transconductance amplifier and provides equalization during both a sampling mode and a data latching mode. A gain of the variable gain negative resistance equalizing circuit can be tuned or adjusted in response to a control signal fed back from an output of the current-to-voltage converter. In one embodiment, the gain is adjusted based on pulse width. Input sensitivity can be improved by compensating the high frequency gain response. The data sampler is an analog operational circuit having current mode logic (CML) and differential signals with a constant DC current in both the sampling mode and the latching mode. This provides for increased input sensitivity over conventional CMOS (complementary metal-oxide semiconductor) circuits having rail-to-rail operations.

In one embodiment, there is provided, a data sampler circuit comprising: a transconductance amplifier having an input and an output; a latch circuit coupled to the output of the transconductance amplifier; a current-to-voltage converter having an input coupled to the output of the transconductance amplifier, and an output for providing a feedback signal to the latch circuit; and a negative resistance circuit coupled to the output of the transconductance amplifier. The transconductance amplifier may comprise a differential pair of transistors having control electrodes coupled to receive a differential signal. The negative resistance circuit may comprise a pair of cross-coupled transistors. The negative resistance circuit may further comprise a gain compensation circuit for varying a gain of the negative resistance circuit in response to a control signal. The transconductance amplifier may comprise: a first current source having a first terminal coupled to a first power supply terminal, and a second terminal; a second current source having a first terminal coupled to the first power supply terminal, and a second terminal; a first transistor having a first current electrode coupled to the second terminal of the first current source, a control electrode for receiving a first input signal, and a second current electrode; a second transistor having a first current electrode coupled to the second terminal of the second current source, a control electrode for receiving a second input signal, and a second current electrode coupled to the second current electrode of the first transistor; and a third transistor having a first current electrode coupled to the second current electrodes of the first and second transistors, a control electrode for receiving a first clock signal, and a second current electrode. The latch circuit may comprise: a fourth transistor having a first current electrode coupled to the first current electrode of the first transistor, a control electrode, and a second current electrode; a fifth transistor having a first current electrode coupled to the first current electrode of the second transistor, a control electrode, and a second current electrode coupled to the second current electrode of the fourth transistor; and a sixth transistor having a first current electrode coupled to the second current electrodes of the fourth and fifth transistors, a control electrode for receiving a second clock signal, and a second current electrode. The negative resistance circuit may comprise: a seventh transistor having a first current electrode coupled to the first power supply voltage terminal, a control electrode coupled to the first current electrode of the fifth transistor, and a second current electrode coupled to the first current electrode of the fourth transistor; an eighth transistor having a first current electrode coupled to the first power supply voltage terminal, a control electrode coupled to the first current electrode of the fourth transistor, and a second current electrode coupled to the first current electrode of the fifth transistor; a first variable resistor having a first terminal coupled to receive a bias voltage, a control terminal for receiving a control signal, and a second terminal coupled to the control electrode of the seventh transistor; and a second variable resistor having a first terminal coupled to receive the bias voltage, a control terminal for receiving the control signal, and a second terminal coupled to the control electrode of the eighth transistor. The current-to-voltage converter may further comprise: a third current source having a first terminal coupled to the first power supply voltage terminal, and a second terminal; a fourth current source having a first terminal coupled to the first power supply voltage terminal, and a second terminal; a ninth transistor having first current electrode coupled to the second terminal of the fourth current source, a control electrode coupled to the first current electrode of the first transistor, and a second current electrode; and a tenth transistor having a first current electrode coupled to the second terminal of the fourth current source, a control electrode coupled to the first current electrode of the second transistor, and a second current electrode coupled to the second current electrode of the ninth transistor. The data sampler circuit may be one of a plurality of data sampler circuits in a receiver circuit.

In another embodiment, there is provided, a receiver comprising: an amplifier coupled to a channel for receiving serial data signals; and a plurality of data samplers coupled to the amplifier, each of the plurality of data samplers comprising: a transconductance amplifier having an input and an output; a latch circuit coupled to the output of the transconductance amplifier; a current-to-voltage converter having an input coupled to the output of the transconductance amplifier, and an output for providing a feedback signal to the latch circuit; and a variable gain negative resistance circuit coupled to the output of the transconductance amplifier, the variable gain negative resistance circuit for providing tunable equalization for the receiver; a control circuit having an input coupled to the output of the current-to-voltage converter, and an output for providing a control signal to the variable gain negative resistance circuit. The receiver may further comprise a channel comprises a transmission line. The transconductance amplifier may comprise: a first current source having a first terminal coupled to a first power supply terminal, and a second terminal; a second current source having a first terminal coupled to the first power supply terminal, and a second terminal; a first transistor having a first current electrode coupled to the second terminal of the first current source, a control electrode for receiving a first input signal, and a second current electrode; a second transistor having a first current electrode coupled to the second terminal of the second current source, a control electrode for receiving a second input signal, and a second current electrode coupled to the second current electrode of the first transistor; and a third transistor having a first current electrode coupled to the second current electrodes of the first and second transistors, a control electrode for receiving a first clock signal, and a second current electrode. The latch circuit may comprise: a fourth transistor having a first current electrode coupled to the first current electrode of the first transistor, a control electrode, and a second current electrode; a fifth transistor having a first current electrode coupled to the first current electrode of the second transistor, a control electrode, and a second current electrode coupled to the second current electrode of the fourth transistor; and a sixth transistor having a first current electrode coupled to the second current electrodes of the fourth and fifth transistors, a control electrode for receiving a second clock signal, and a second current electrode. The negative resistance circuit may comprise: a seventh transistor having a first current electrode coupled to the first power supply voltage terminal, a control electrode coupled to the first current electrode of the fifth transistor, and a second current electrode coupled to the first current electrode of the fourth transistor; an eighth transistor having a first current electrode coupled to the first power supply voltage terminal, a control electrode coupled to the first current electrode of the fourth transistor, and a second current electrode coupled to the first current electrode of the fifth transistor; a first variable resistor having a first terminal coupled to receive a bias voltage, a control terminal for receiving a control signal, and a second terminal coupled to the control electrode of the seventh transistor; and a second variable resistor having a first terminal coupled to receive the bias voltage, a control terminal for receiving the control signal, and a second terminal coupled to the control electrode of the eighth transistor. The current-to-voltage converter may further comprise: a third current source having a first terminal coupled to the first power supply voltage terminal, and a second terminal; a fourth current source having a first terminal coupled to the first power supply voltage terminal, and a second terminal; a ninth transistor having first current electrode coupled to the second terminal of the fourth current source, a control electrode coupled to the first current electrode of the first transistor, and a second current electrode; and a tenth transistor having a first current electrode coupled to the second terminal of the fourth current source, a control electrode coupled to the first current electrode of the second transistor, and a second current electrode coupled to the second current electrode of the ninth transistor.

In yet another embodiment, there is provided, a method for sampling a serial data stream in a receiver, the method comprising: receiving a differential data signal from the serial data stream with a transconductance amplifier in response to a first clock signal; latching a logic state of the differential data signal in response to a second clock signal; equalizing the differential data signal during both the receiving and the latching of the differential data signal using a negative resistance equalizer circuit; and adjusting a gain of the negative resistance equalizer circuit may be based on a control voltage. Equalizing the differential data signal during both the receiving and the latching of the differential data signal using the negative resistance equalizer circuit may further comprise equalizing with a pair of cross-coupled transistors. The differential data signal may comprise a differential current, the method may further comprise converting the differential current to a differential voltage using a current-to-voltage converter. Latching the logic state of the differential data signal may further comprise feeding back an output signal of the of the current-to-voltage converter to a latch circuit. Equalizing the differential data signal may further comprise adjusting a gain of the negative resistance equalizer circuit based on an output signal of the negative resistance equalizer circuit.

FIG. 1 illustrates a serial data transmission system 10 in accordance with an embodiment. Data transmission system 10 includes channels 12 and 14, T-coil/ESD portions 16 and 18, resister termination circuit 20, and receiver 11. Data transmission system 10 may be part of a system that complies with one or more communications standards or protocols, such as for example, IEEE 802.3bj, 100 Gb Ethernet, PCI-Express Generation 4, CPRI, RapidIO 2.1 etc. Receiver 11 includes capacitors 22 and 24, offset voltage correcting (VOS) digital to analog converters (DACs) 26, VGA 28, pre-equalized samplers 30, clock and data recovery circuit 32, digital control circuit 34, and phase interpolator 36. A transmitter (TX) transmits differential signals over channels 12 and 14. After channels 12 and 14, the signals go through T-coil/ESD portions 16 and 18. The T-coil, also known and bridge-T network consists of two mutual inductors used for impedance matching and reduction of input return-loss. Also included with each T-coil are diodes for electrostatic discharge (ESD) protection. The signals are then transmitted through capacitors 22 and 24, which operate as alternating current (AC) coupling capacitors, to input nodes of variable gain amplifier (VGA) 28. Resister termination network (R-Term) 20 is coupled between T-coil/ESD portions 16 and 18 and capacitors 22 and 24. Resister termination network 20 provides a self-calibrated input impedance. For example, resistor termination network 20 may provide a self-calibrated 100-Ohm differential input impedance.

Pre-equalized samplers 30 includes any number of pre-equalized samplers. In some embodiments, samplers 30 may also be known as phase detectors, such as when used in a phase locked loop (PLL). In prior art receivers, the sampling function and equalizing function were separate. One aspect of the illustrated embodiment is to combine the sampling and equalizing functions into one circuit block. Samplers 30 have differential inputs V1 and V2 coupled to differential outputs of VGA 28. Samplers 30 receive a sequence of input signals, provides conditioning for the input signals, and determines the logic state of each input signal. Differential outputs VOP1-VOPN and VON1-VONN of samplers 30 are coupled to inputs of CDR 32. An output of CDR 32 provides data signals DATA. Control signals CONTROL are fed back to samplers 30 and operate to adjust, or tune, the gain of the equalizer function of samplers 30 based on pulse widths of the data signals output from samplers 30. For example, because operation at wider pulse widths may require less gain than operation at narrower pulse widths, the gain may be adjusted so that the signal amplitudes of an output of samplers 30 are relatively constant over different varying pulse widths. Adjusting the equalizer gain in this manner therefore improves the signal quality and sensitivity and reduces jitter in the transmitted signal through the channel.

Clock and data recovery (CDR) circuit 32 provides feedback to PI 36. PI 36 is coupled to samplers 30 and is used to generate output signal phase shifts in discrete increment steps. PI 36 sends in-phase and quadrature clocks CK1-CKN and CKB1-CKBN to sample the data signal at samplers 30. The clock (CK) and clock bar (CKB) signals are 180 degrees out of phase with each other. When CDR 32 settles to a steady state, the in-phase clock will be lined up to the center of the data signal and the quadrature clock is present at the transition-edge of the data signal.

Figure 2:
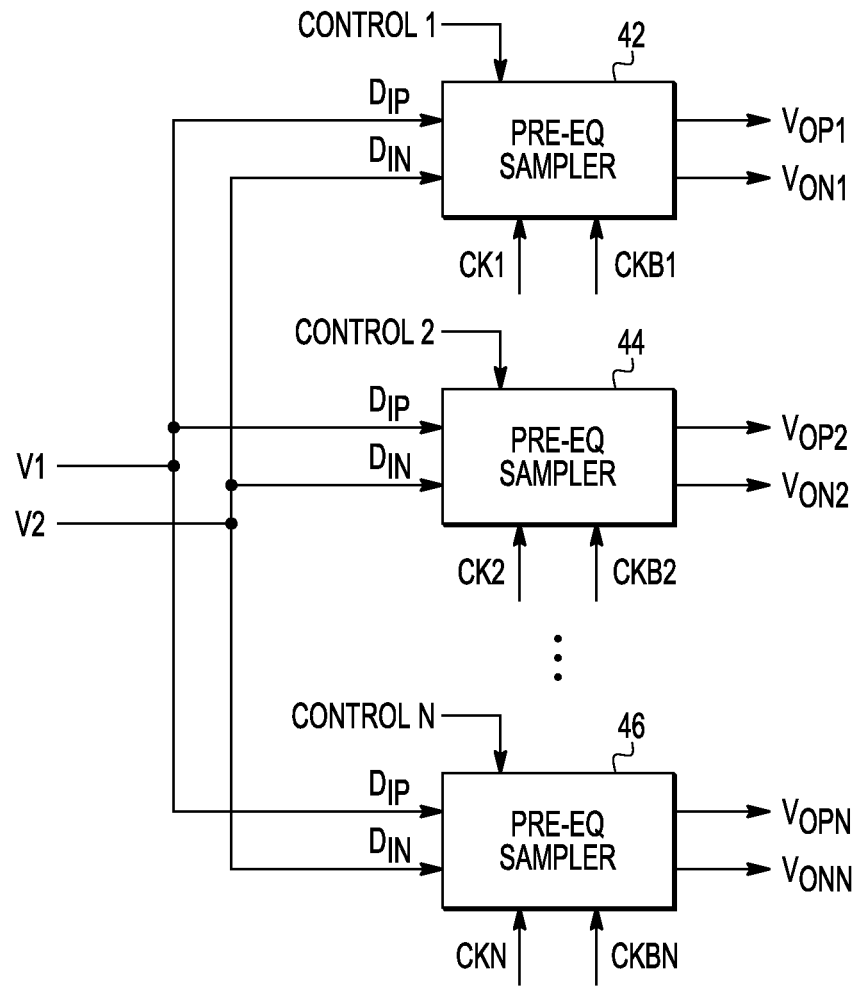
FIG. 2 illustrates the pre-equalized samplers of the data transmission system of FIG. 1 in accordance with an embodiment.

FIG. 2 illustrates the pre-equalized samplers 30 of the data transmission system 10 of FIG. 1 in accordance with an embodiment. Pre-equalized samplers 30 includes a plurality of samplers, such as for example, samplers 42, 44, and 46. There can be any number of samplers. Each sampler receives differential input signals V1 and V2 from VGA 28 at a positive input labeled "DIP" and a negative input labeled "DIN". Sampler 42 receives feedback control signal CONTROL1 and clock signals CK1 and CKB1, and in response, provides differential output signals VOP1 and VON1. Sampler 44 receives feedback control signal CONTROL2 and clock signals CK2 and CKB2, and in response, provides differential output signals VOP2 and VON2. Sampler 46 receives feedback control signal CONTROLN and clock signals CKN and CKBN, and in response, provides differential output signals VOPN and VONN, where the letter "N" at the end of the signal names represents an integer. Differential clock signals CK1/CKB1, CK2/CKB2, and CKN/CKBN control when data is sampled and when data is latched in each of samplers 42, 44, and 46. In one embodiment, the differential clock signals are 90 degrees out of phase with each other.

Figure 3:
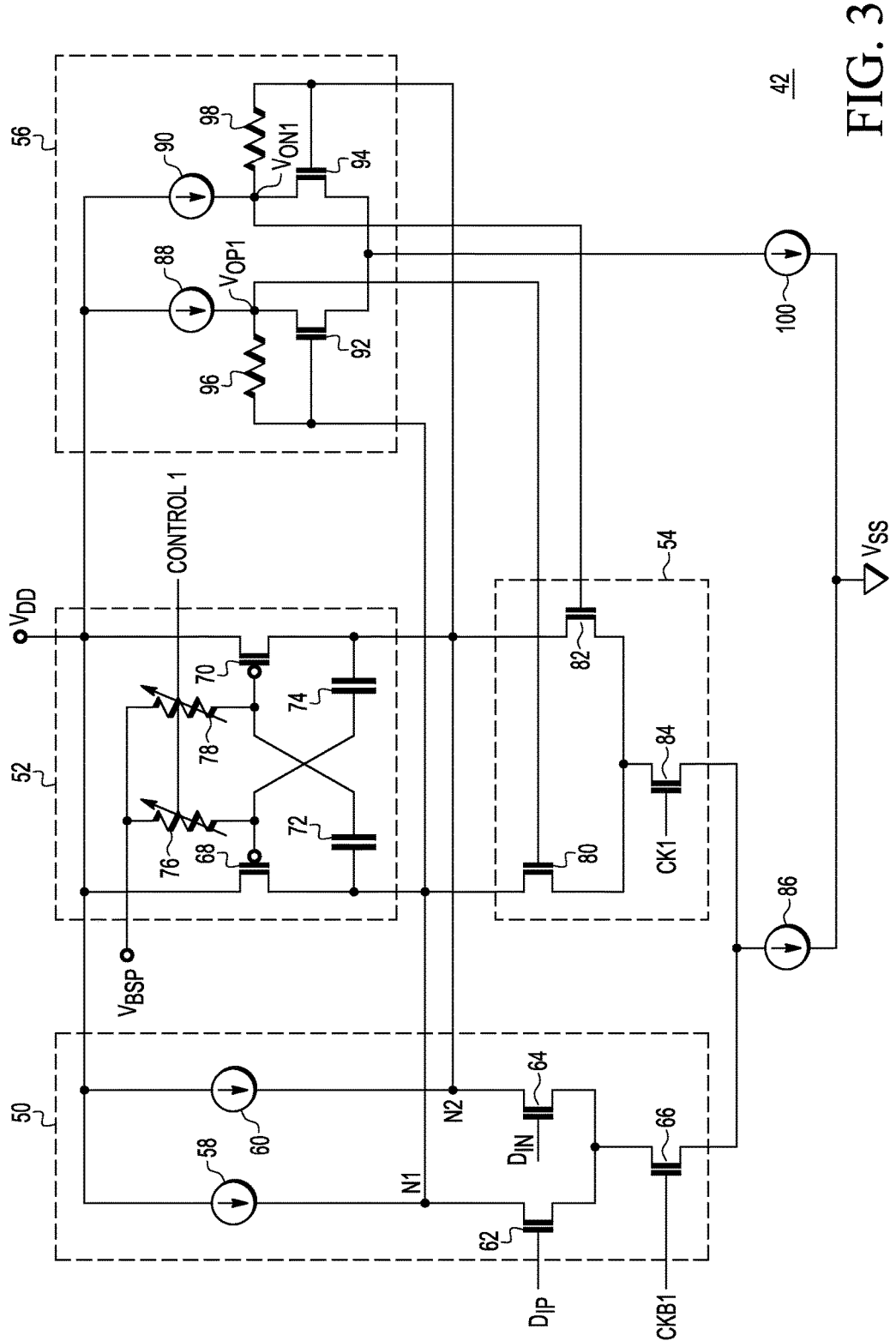
FIG. 3 illustrates one of the pre-equalized samplers of FIG. 2 in accordance with an embodiment.

FIG. 3 illustrates pre-equalized sampler 42 of FIG. 2 in accordance with an embodiment. In the illustrated embodiment, sampler circuit 42 is implemented in a CMOS process on a semiconductor substrate (not shown) along with other circuit blocks to form an integrated circuit. In other embodiments, sampler circuit 42 may be implemented differently. Pre-equalized sampler 42 includes transconductance amplifier 50, variable gain negative resistance equalizer circuit 52, latch circuit 54, current-to-voltage converter 56, and current sources 86 and 100. Transconductance amplifier 50 includes current sources 58 and 60, and N-channel transistors 62, 64, and 66. Variable gain negative resistance equalizer circuit 52 includes cross-coupled P-channel transistors 68 and 70, variable resistive elements 76 and 78, and capacitors 72 and 74. Latch circuit 54 includes N-channel transistors 80, 82, and 84. Current-to-voltage converter circuit 56 includes current sources 88 and 90, N-channel transistors 92 and 94, and resistive elements 96 and 98. Sampler circuit 42 is based on current mode logic (CML), but other embodiments may be different.

In transconductance amplifier 50, Current source 58 has a first terminal connected to a power supply voltage terminal labeled "VDD", and a second terminal coupled to a node labeled "N1". Current source 60 has a first terminal connected to power supply voltage terminal VDD, and a second terminal connected to a node labeled "N2". N-channel transistor 62 has a first current electrode connected to node N1, a control electrode for receiving input data signal DIP1, and a second current electrode. N-channel transistor 64 has a first current electrode connected to node N2, a control electrode for receiving input data signal DIN1, and a second current electrode connected to the second current electrode of N-channel transistor 62. N-channel transistor 66 has a first current electrode connected to the second current electrodes of N-channel transistors 62 and 64, a control electrode for receiving clock signal CKB1, and a second current electrode.

In variable gain negative resistance equalizer circuit 52, P-channel transistor 68 has a first current electrode connected power supply voltage terminal VDD, a control electrode, and a second current electrode connected to node N1. P-channel transistor 70 has a first current electrode connected to power supply voltage terminal VDD, a control electrode, and a second current electrode connected to node N2. Capacitor 72 has a first plate electrode connected to node N1, and a second plate electrode connected to the control electrode of P-channel transistor 70. Capacitor 74 has a first plate electrode connected to node N2, and a second plate electrode connected to the control electrode of P-channel transistor 68. Variable resistive element 76 has a first terminal coupled to receive a bias voltage labeled "VBSP", a second terminal connected to the control electrode of P-channel transistor 68, and a control terminal for receiving control signal CONTROL1. Control signal CONTROL1 is a multi-bit control signal from digital control 34 (FIG. 1). N-channel transistor 80 has a first current electrode connected to node N1, a control electrode, and a second current electrode. N-channel transistor 82 has a first current electrode connected to node N2, a control electrode, and a second current electrode connected to the second current electrode of N-channel transistor 80. N-channel transistor 84 has a first current electrode connected to the second current electrodes of N-channel transistors 80 and 82, a control electrode for receiving clock signal CK1, and a second current electrode. Current source 86 has a first terminal connected to the second current electrodes of N-channel transistors 66 and 84, and a second terminal connected to a power supply voltage terminal labeled "VSS". In one embodiment, power supply voltage terminal VDD is coupled to receive a positive power supply voltage and power supply voltage terminal VSS is coupled to ground. In other embodiments, the power supply voltages may be different. Variable gain negative resistance equalizing circuit 52 is used to compensate for and overcome the positive resistance of transconductance amplifier 50. The illustrated embodiment uses cross-coupled P-channel transistors 68 and 70 to provide negative resistance. In other embodiments, the negative resistance may be provided by another type of circuit component such as a lambda diode, Gunn diode, tunnel diode, or the like.

In current-to-voltage converter 56, current source 88 has a first terminal connected to power supply voltage terminal VDD, and a second terminal connected to output node VOP1. Current source 90 has a first terminal connected to power supply voltage terminal VDD, and a second terminal connected to output node VON1. N-channel transistor 92 has a first current electrode connected to the second terminal of current source 88, a control electrode connected to node N1, and a second current electrode. N-channel transistor 94 has a first current electrode connected to the second terminal of current source 90, a control electrode connected to node N2, and a second current electrode connected to the second current electrode of N-channel transistor 92. Current source 100 has a first terminal connected to the second current electrodes of N-channel transistors 92 and 94, and a second terminal connected to power supply voltage terminal VSS. Resistive element 96 has a first terminal connected to node N1, and a second terminal connected to output node VOP1. Resistive element 98 has a first terminal connected to output node VON1, and a second terminal connected to node N2.

Each of pre-equalizer sampler circuits 44 and 46 are substantially the same as pre-equalizer sampler circuit 42.

In operation, a differential input data signal (DIP1/DIN1) is provided to the control electrodes of N-channel transistors 62 and 64 from a transmitter over channels 12 and 14 (FIG. 1). The input data signals may have relatively small amplitudes because of channel loses. Transconductance amplifier 50 amplifies the relatively small differential input signals and provides a differential current at nodes N1 and N2 in response to clock signal CKB1 being a logic high voltage. Note that when clock signal CKB1 is a logic high, clock signal CK1 is a logic low. In the illustrated embodiment, a sampling mode occurs with CKB1 is a logic high causing N-channel transistor 66 to be conductive. During the sampling mode, variable gain negative resistance circuit 52 is used to provide tunable equalization that conditions the input data signal with different gains. In one embodiment, the different gains may correspond to different pulse widths as determined by control signal CONTROL1, provided as a feedback signal from digital control 34. Alternately, the gains may be adjusted for different channel ISI (inter-symbol interference) in addition to, or instead of, pulse widths. More specifically, the gate voltage of cross-coupled P-channel transistors 68 and 70 is controlled by varying the resistance of variable resistors 76 and 78 in response to control signal CONTROL1. Current-to-voltage converter 56 operates as a load for transconductance circuit 50 during the sampling mode. The current-to-voltage converter 56 presents a low impedance to an AC current. The output of current-to-voltage converter 56 provides the output signals VOP1 and VON1 to CDR 32 and provides the feedback signal to transistors 80 and 82 during the latching mode. When clock signal CKB1 is a logic low, clock signal CK1 is a logic high. N-channel transistor 66 becomes non-conductive, ending the sampling mode and beginning the latching, or hold, mode. During latching mode, N-channel transistor 84 is conductive, enabling N-channel transistors 80 and 82. The logic states of nodes N1 and N2 are provided to the gates of N-channel transistors 92 and 94. One of transistors 92 and 94 is conductive and the other is non-conductive, causing one of output signals VOP1 and VON1 to be high while the other is low. The output signals VOP1 and VON1 are fed back to the gates of transistors 80 and 82 causing the logic values on nodes N1 and N2 to be latched until changed by a changing differential input signal DIP1 and DIN1 in the next sampling mode cycle. Variable gain negative resistance equalizing circuit 52 remains activated and responsive to control signal CONTROL1 during both sampling mode and latching mode. Capacitors 72 and 74 are used to prevent a large DC gain which may split the DC common-mode, and to maintain the generation of the negative resistance for AC signals.

The disclosed sampler circuit provides a combined sampler sensitive to small amplitude input signals and that changes the input sensitivity based on pulse width.

Minor modifications can be made to data sampler circuit 42 to provide additional or different functionality. For example, analog division, phase modulation, and ISI signal equalization functions can be obtained by coupling together the second current electrodes of transistors 92 and 94 with a resistive element and replacing current source 100 with a two parallel arrangements of current sources and capacitors between the ends of the resistive element and VSS.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A data sampler circuit comprising: a transconductance amplifier having an input and an output; a latch circuit coupled to the output of the transconductance amplifier; a current-to-voltage converter having an input coupled to the output of the transconductance amplifier, and an output for providing a feedback signal to the latch circuit; and a negative resistance circuit coupled to the output of the transconductance amplifier, a control circuit having an input coupled to the output of the current-to-voltage converter, and a output for providing a control signal to the variable gain negative resistance circuit.

2. The data sampler circuit of claim 1, wherein the transconductance amplifier comprises a differential pair of transistors having control electrodes coupled to receive a differential signal.

3. The data sampler circuit of claim 1, wherein the negative resistance circuit comprises a pair of cross-coupled transistors.

4. The data sampler circuit of claim 1, wherein the negative resistance circuit further comprises a gain compensation circuit for varying a gain of the negative resistance circuit in response to a control signal.

5. The data sampler circuit of claim 1, wherein the transconductance amplifier comprises:
 a first current source having a first terminal coupled to a first power supply terminal, and a second terminal;
 a second current source having a first terminal coupled to the first power supply terminal, and a second terminal;
 a first transistor having a first current electrode coupled to the second terminal of the first current source, a control electrode for receiving a first input signal, and a second current electrode;
 a second transistor having a first current electrode coupled to the second terminal of the second current source, a control electrode for receiving a second input signal, and a second current electrode coupled to the second current electrode of the first transistor; and
 a third transistor having a first current electrode coupled to the second current electrodes of the first and second transistors, a control electrode for receiving a first clock signal, and a second current electrode.

6. The data sampler circuit of claim 5, wherein the latch circuit comprises:
 a fourth transistor having a first current electrode coupled to the first current electrode of the first transistor, a control electrode, and a second current electrode;
 a fifth transistor having a first current electrode coupled to the first current electrode of the second transistor, a control electrode, and a second current electrode coupled to the second current electrode of the fourth transistor; and
 a sixth transistor having a first current electrode coupled to the second current electrodes of the fourth and fifth transistors, a control electrode for receiving a second clock signal, and a second current electrode.

7. The data sampler circuit of claim 6, wherein the negative resistance circuit comprises:
 a seventh transistor having a first current electrode coupled to the first power supply voltage terminal, a control electrode, and a second current electrode coupled to the first current electrode of the fourth transistor;
 a first capacitor having a first plate electrode coupled to the control electrode of the seventh transistor, and a second plate electrode coupled to the first current electrode of the fifth transistor;
 an eighth transistor having a first current electrode coupled to the first power supply voltage terminal, a control electrode, and a second current electrode coupled to the first current electrode of the fifth transistor;
 a second capacitor having a first plate electrode coupled to the control electrode of the eighth transistor, and a second plate electrode coupled to the first current electrode of the fourth transistor;
 a first variable resistor having a first terminal coupled to receive a bias voltage, a control terminal for receiving a control signal, and a second terminal coupled to the control electrode of the seventh transistor; and
 a second variable resistor having a first terminal coupled to receive the bias voltage, a control terminal for receiving the control signal, and a second terminal coupled to the control electrode of the eighth transistor.

8. The data sampler circuit of claim 7, wherein the current-to-voltage converter further comprises:
 a third current source having a first terminal coupled to the first power supply voltage terminal, and a second terminal;
 a fourth current source having a first terminal coupled to the first power supply voltage terminal, and a second terminal;
 a ninth transistor having first current electrode coupled to the second terminal of the third current source, a control electrode coupled to the first current electrode of the first transistor, and a second current electrode;
 a first resistor having a first terminal coupled to the control electrode of the ninth transistor, and a second terminal coupled to the first current electrode of the ninth transistor;
 a tenth transistor having a first current electrode coupled to the second terminal of the fourth current source, a control electrode coupled to the first current electrode of the second transistor, and a second current electrode coupled to the second current electrode of the ninth transistor; and
 a second resistor having a first terminal coupled to the control electrode of the tenth transistor, and a second terminal coupled to the first current electrode of the tenth transistor.

9. The data sampler circuit of claim 1, wherein the data sampler circuit is one of a plurality of data sampler circuits in a receiver circuit.

10. A receiver comprising:
 an amplifier coupled to a channel for receiving serial data signals; and
 a plurality of data samplers coupled to the amplifier, each of the plurality of data samplers comprising:
  a transconductance amplifier having an input and an output;
  a latch circuit coupled to the output of the transconductance amplifier;
  a current-to-voltage converter having an input coupled to the output of the transconductance amplifier, and an output for providing a feedback signal to the latch circuit; and
  a variable gain negative resistance circuit coupled to the output of the transconductance amplifier, the variable gain negative resistance circuit for providing tunable equalization for the receiver;
 a control circuit having an input coupled to the output of the current-to-voltage converter, and a output for providing a control signal to the variable gain negative resistance circuit.

11. The receiver of claim 10 further comprising a channel comprises a transmission line.

12. The receiver of claim 10, wherein the transconductance amplifier comprises:

a first current source having a first terminal coupled to a first power supply terminal, and a second terminal;

a second current source having a first terminal coupled to the first power supply terminal, and a second terminal;

a first transistor having a first current electrode coupled to the second terminal of the first current source, a control electrode for receiving a first input signal, and a second current electrode;

a second transistor having a first current electrode coupled to the second terminal of the second current source, a control electrode for receiving a second input signal, and a second current electrode coupled to the second current electrode of the first transistor; and a third transistor having a first current electrode coupled to the second current electrodes of the first and second transistors, a control electrode for receiving a first clock signal, and a second current electrode.

13. The receiver of claim 12, wherein the latch circuit comprises:

a fourth transistor having a first current electrode coupled to the first current electrode of the first transistor, a control electrode, and a second current electrode;

a fifth transistor having a first current electrode coupled to the first current electrode of the second transistor, a control electrode, and a second current electrode coupled to the second current electrode of the fourth transistor; and a sixth transistor having a first current electrode coupled to the second current electrodes of the fourth and fifth transistors, a control electrode for receiving a second clock signal, and a second current electrode.

14. The data sampler circuit of claim 13, wherein the negative resistance circuit comprises:

a seventh transistor having a first current electrode coupled to the first power supply voltage terminal, a control electrode, and a second current electrode coupled to the first current electrode of the fourth transistor;

a first capacitor having a first plate electrode coupled to the control electrode of the seventh transistor, and a second plate electrode coupled to the first current electrode of the fifth transistor;

an eighth transistor having a first current electrode coupled to the first power supply voltage terminal, a control electrode, and a second current electrode coupled to the first current electrode of the fifth transistor;

a second capacitor having a first plate electrode coupled to the control electrode of the eighth transistor, and a second plate electrode coupled to the first current electrode of the fourth transistor;

a first variable resistor having a first terminal coupled to receive a bias voltage, a control terminal for receiving a control signal, and a second terminal coupled to the control electrode of the seventh transistor; and a second variable resistor having a first terminal coupled to receive the bias voltage, a control terminal for receiving the control signal, and a second terminal coupled to the control electrode of the eighth transistor.

15. The data sampler circuit of claim 14, wherein the current-to-voltage converter further comprises:

a third current source having a first terminal coupled to the first power supply voltage terminal, and a second terminal;

a fourth current source having a first terminal coupled to the first power supply voltage terminal, and a second terminal;

a ninth transistor having first current electrode coupled to the second terminal of the third current source, a control electrode coupled to the first current electrode of the first transistor, and a second current electrode;

a first resistor having a first terminal coupled to the control electrode of the ninth transistor, and a second terminal coupled to the first current electrode of the ninth transistor;

a tenth transistor having a first current electrode coupled to the second terminal of the fourth current source, a control electrode coupled to the first current electrode of the second transistor, and a second current electrode coupled to the second current electrode of the ninth transistor; and a second resistor having a first terminal coupled to the control electrode of the tenth transistor, and a second terminal coupled to the first current electrode of the tenth transistor.

16. In a receiver for receiving a serial data stream from a channel, a method for sampling the serial data stream, the method comprising:

receiving a differential data signal from the serial data stream with a transconductance amplifier in response to a first clock signal;

latching a logic state of the differential data signal in response to a second clock signal;

equalizing the differential data signal during both the receiving and the latching of the differential data signal using a negative resistance equalizer circuit; and adjusting a gain of the negative resistance equalizer circuit based on a control voltage.

17. The method of claim 16, wherein equalizing the differential data signal during both the receiving and the latching of the differential data signal using the negative resistance equalizer circuit further comprises equalizing with a pair of cross-coupled transistors.

18. The method of claim 16, wherein the differential data signal comprises a differential current, the method further comprising converting the differential current to a differential voltage using a current-to-voltage converter.

19. The method of claim 18, wherein latching the logic state of the differential data signal further comprises feeding back an output signal of the of the current-to-voltage converter to a latch circuit.

20. The method of claim 16, wherein equalizing the differential data signal further comprises adjusting a gain of the negative resistance equalizer circuit based on an output signal of the negative resistance equalizer circuit.

* * * * *